United States Patent
Masuoka et al.

(10) Patent No.: US 10,396,197 B2
(45) Date of Patent: Aug. 27, 2019

(54) SEMICONDUCTOR DEVICE AND METHOD FOR PRODUCING SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/858,176

(22) Filed: Dec. 29, 2017

(65) Prior Publication Data
US 2018/0122940 A1 May 3, 2018

Related U.S. Application Data

(63) Continuation of application No. PCT/JP2015/082254, filed on Nov. 17, 2015.

(51) Int. Cl.
*H01L 29/78* (2006.01)
*H01L 29/06* (2006.01)
(Continued)

(52) U.S. Cl.
CPC ...... *H01L 29/7827* (2013.01); *H01L 29/0657* (2013.01); *H01L 29/42356* (2013.01);
(Continued)

(58) Field of Classification Search
CPC ............. H01L 29/7827; H01L 29/0657; H01L 29/66787; H01L 29/42356;
(Continued)

(56) References Cited

U.S. PATENT DOCUMENTS

| | | | |
|---|---|---|---|
| 2008/0251825 A1* | 10/2008 | Lee | ........................ G11C 11/403 257/297 |
| 2010/0207201 A1 | 8/2010 | Masuoka et al. | |

(Continued)

FOREIGN PATENT DOCUMENTS

| | | |
|---|---|---|
| JP | 02-71556 A | 3/1990 |
| JP | 02-188966 A | 7/1990 |

(Continued)

OTHER PUBLICATIONS

International Search Report, and English language translation thereof, in corresponding International Application No. PCT/JP2015/082254, dated Dec. 15, 2015, 5 pages.
(Continued)

*Primary Examiner* — Ahmed N Sefer
(74) *Attorney, Agent, or Firm* — Brinks Gilson & Lione

(57) ABSTRACT

A semiconductor device includes a planar semiconductor layer formed on a substrate; a pillar-shaped semiconductor layer formed on the planar semiconductor layer; a gate insulating film surrounding the pillar-shaped semiconductor layer; a first metal surrounding the gate insulating film, the first metal being in contact with an upper portion of the planar semiconductor layer; a gate formed above the first metal so as to surround the gate insulating film, the gate being electrically insulated from the first metal; and a second metal formed above the gate so as to surround the gate insulating film, the second metal being electrically insulated from the gate, the second metal having an upper portion electrically connected to an upper portion of the pillar-shaped semiconductor layer.

2 Claims, 21 Drawing Sheets

(51) Int. Cl.
  *H01L 29/423* (2006.01)
  *H01L 29/66* (2006.01)
(52) U.S. Cl.
  CPC .. *H01L 29/66666* (2013.01); *H01L 29/66787* (2013.01); *H01L 29/78* (2013.01)
(58) Field of Classification Search
  CPC ........... H01L 29/66666; H01L 29/7788; H01L 29/7831; H01L 29/4908; H01L 29/42392; H01L 29/78345
  See application file for complete search history.

(56) References Cited

U.S. PATENT DOCUMENTS

| | | | | |
|---|---|---|---|---|
| 2011/0115011 A1* | 5/2011 | Masuoka | ........ | H01L 21/823431 257/314 |
| 2013/0015500 A1* | 1/2013 | Izumida | ............ | H01L 29/42368 257/192 |
| 2014/0209998 A1* | 7/2014 | Masuoka | .......... | H01L 29/42392 257/329 |
| 2015/0144866 A1* | 5/2015 | Masuoka | ............... | H01L 45/126 257/5 |
| 2015/0236086 A1 | 8/2015 | Colinge et al. | | |
| 2017/0005106 A1* | 1/2017 | Zhang | ............... | H01L 29/42392 |
| 2018/0047823 A1* | 2/2018 | Masuoka | ................ | H01L 29/78 |
| 2018/0062009 A1* | 3/2018 | Masuoka | ................ | H01L 29/78 |

FOREIGN PATENT DOCUMENTS

| | | | |
|---|---|---|---|
| JP | 03-145761 A | | 6/1991 |
| JP | 2003-289142 | * | 10/2003 |
| JP | 2009-182318 A | | 8/2009 |
| JP | 2015-019103 A | | 1/2015 |
| JP | 2015-057852 A | | 3/2015 |
| JP | 2015-188115 A | | 10/2015 |
| WO | WO 2013/175557 A1 | | 11/2013 |
| WO | WO 2014/115305 A1 | | 7/2014 |

OTHER PUBLICATIONS

WIPO, International Preliminary Report on Patentability, in Application No. PCT/JP2015/082254 dated May 31, 2018, pp. 1-6.

* cited by examiner

SEMICONDUCTOR DEVICE AND METHOD FOR PRODUCING SEMICONDUCTOR DEVICE

RELATED APPLICATIONS

The present application is a continuation of International Application PCT/JP2015/082254, with an international filing date of Nov. 17, 2015, the entire contents of which are incorporated herein by reference.

BACKGROUND OF THE INVENTION

1. Field of the Invention

The present invention relates to a semiconductor device and a method for producing a semiconductor device.

2. Description of the Related Art

Semiconductor integrated circuits, in particular, integrated circuits including MOS transistors, have been produced with a continuous increase in the degree of integration. With this increase in the degree of integration, MOS transistors used in such integrated circuits have come to be produced with reduced dimensions on the order of nanometers. With such a reduction in the dimensions of MOS transistors, the leakage current is difficult to suppress; since a required amount of current needs to be ensured, a reduction in the area of circuits is difficult to achieve, which has been problematic. In order to address such a problem, a Surrounding Gate Transistor (SGT) has been proposed, which has a structure in which the source, the gate, and the drain are disposed in a direction perpendicular to the substrate, and the gate surrounds a pillar-shaped semiconductor layer (for example, Japanese Unexamined Patent Application Publication Nos. 2-71556, 2-188966, and 3-145761).

Forming a gate electrode after formation of the pillar-shaped semiconductor layer has been proposed (for example, Japanese Unexamined Patent Application Publication No. 2015-188115). However, when the pillar-shaped semiconductor layer is narrow, whether or not the pillar-shaped semiconductor layer can be formed so as to stand upright is not known.

An SGT has been proposed that has a structure in which a transistor is formed with a work function difference between a metal and a semiconductor (for example, Japanese Unexamined Patent Application Publication No. 2015-19103). Japanese Unexamined Patent Application Publication No. 2015-19103 discloses the structure of a single SGT.

Another SGT has been proposed that has a structure in which a transistor is formed with a work function difference between a metal and a semiconductor (for example, Japanese Unexamined Patent Application Publication No. 2015-57852). Japanese Unexamined Patent Application Publication No. 2015-57852 discloses a semiconductor device including a fin-shaped semiconductor layer formed on a substrate, a first insulating film formed around the fin-shaped semiconductor layer, a first metal film formed around the first insulating film, and a pillar-shaped semiconductor layer formed on the fin-shaped semiconductor layer, the fin-shaped semiconductor layer having an upper portion connected to the first metal film. This configuration requires a structure that connects together the upper portion of the fin-shaped semiconductor layer and the first metal, which surrounds the fin-shaped semiconductor layer with the first insulating film therebetween.

SUMMARY OF THE INVENTION

Accordingly, it is an object of the present invention to provide a method for producing a semiconductor device in which a pillar-shaped semiconductor layer is formed after the gate is formed, and a semiconductor device that enables high-speed operations.

A semiconductor device according to an embodiment of the present invention includes a planar semiconductor layer formed on a substrate; a pillar-shaped semiconductor layer formed on the planar semiconductor layer; a gate insulating film surrounding the pillar-shaped semiconductor layer; a first metal surrounding the gate insulating film, the first metal being in contact with an upper portion of the planar semiconductor layer; a gate formed above the first metal so as to surround the gate insulating film, the gate being electrically insulated from the first metal; and a second metal formed above the gate so as to surround the gate insulating film, the second metal being electrically insulated from the gate, the second metal having an upper portion electrically connected to an upper portion of the pillar-shaped semiconductor layer.

The first metal may have a first work function, and the first metal and a lower portion of the pillar-shaped semiconductor layer may have a first work function difference therebetween.

The second metal may have a first work function, and the second metal and an upper portion of the pillar-shaped semiconductor layer may have a first work function difference therebetween.

The first work function may be from 4.0 eV to 4.2 eV.
The first work function may be from 5.0 eV to 5.2 eV.
The semiconductor device may further include an element isolation insulating film surrounding the planar semiconductor layer, and the first metal may extend over the element isolation insulating film.

The semiconductor device may further include a diffusion layer in an upper portion of the planar semiconductor layer.

The semiconductor device may further include a diffusion layer in an upper portion of the pillar-shaped semiconductor layer.

A method for producing a semiconductor device according to an embodiment of the present invention includes forming a first metal on a planar semiconductor layer formed on a substrate; forming a first insulating film on the first metal; forming, on the first insulating film, a gate material formed of metal; forming a second insulating film on the gate material; forming a second metal on the second insulating film; forming a third insulating film on the second metal; forming a first hole for forming a pillar-shaped semiconductor layer, in the third insulating film, the second metal, the second insulating film, the gate material formed of metal, the first insulating film, and the first metal; forming a gate insulating film on a side surface of the first hole; and epitaxially growing a semiconductor layer, within the first hole, on the planar semiconductor layer to form the pillar-shaped semiconductor layer.

The present invention can provide a method for producing a semiconductor device in which a pillar-shaped semiconductor layer is formed after the gate is formed, and a semiconductor device that enables high-speed operations.

A semiconductor device according to an embodiment includes a planar semiconductor layer formed on a substrate; a pillar-shaped semiconductor layer formed on the planar semiconductor layer; a gate insulating film surrounding the pillar-shaped semiconductor layer; a first metal surrounding the gate insulating film, the first metal being in contact with an upper portion of the planar semiconductor layer; a gate formed above the first metal so as to surround the gate insulating film, the gate being electrically insulated from the first metal; and a second metal formed above the gate so as to surround the gate insulating film, the second metal being electrically insulated from the gate, the second metal having an upper portion electrically connected to an upper portion of the pillar-shaped semiconductor layer. Thus, an SGT is formed that has a structure in which a transistor is formed with a work function difference between a metal and a semiconductor. The first metal is in contact with the upper surface of the planar semiconductor layer, so that a portion of the upper surface of the planar semiconductor layer, the portion being in contact with the first metal, serves as a region functioning as an n-type semiconductor layer or a region functioning as a p-type semiconductor layer due to the work function difference between the metal of the layer of the first metal and the semiconductor. Thus, the first metal can be electrically connected to the lower portion of the pillar-shaped semiconductor layer. In addition, the first metal is separated from the lower portion of the pillar-shaped semiconductor layer only with the gate insulating film therebetween, to thereby achieve a decrease in the resistance between the first metal and the lower portion of the pillar-shaped semiconductor layer. Thus, a decrease in the parasitic resistance can be achieved.

The first metal may extend over the element isolation insulating film. In this case, since the first metal is formed of metal, a decrease in the resistance can be achieved between the lower portion of the pillar-shaped semiconductor layer and a contact connected to the first metal.

A method for producing a semiconductor device according to an embodiment includes forming a first metal on a planar semiconductor layer formed on a substrate; forming a first insulating film on the first metal; forming, on the first insulating film, a gate material formed of metal; forming a second insulating film on the gate material; forming a second metal on the second insulating film; forming a third insulating film on the second metal; forming a first hole for forming a pillar-shaped semiconductor layer, in the third insulating film, the second metal, the second insulating film, the gate material formed of metal, the first insulating film, and the first metal; forming a gate insulating film on a side surface of the first hole; and epitaxially growing a semiconductor layer, within the first hole, on the planar semiconductor layer to form the pillar-shaped semiconductor layer. In this way, the pillar-shaped semiconductor layer can be formed after the gate is formed.

In addition, before the epitaxial growth of the pillar-shaped semiconductor layer, the first metal, the gate material formed of metal, and the second metal are covered by the planar semiconductor layer, the first insulating film, the second insulating film, the third insulating film, and the gate insulating film. As a result, metal contamination in the pillar-shaped semiconductor layer can be suppressed.

DETAILED DESCRIPTION OF THE PREFERRED EMBODIMENTS

Figure 1A:
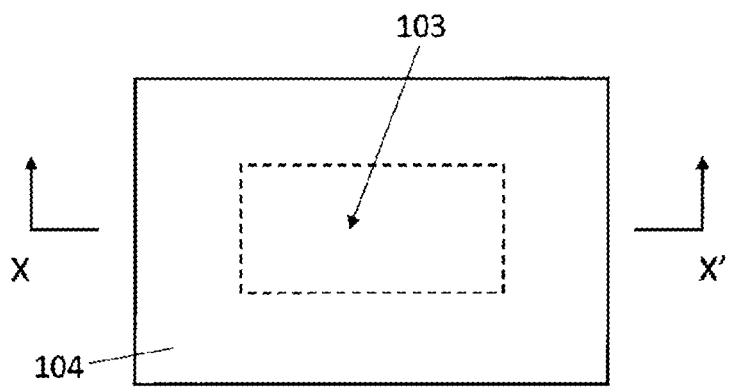
FIG. 1A is a plan view relating to a method for producing a semiconductor device according to an embodiment of the present invention.

Hereinafter, a semiconductor device according to an embodiment of the present invention will be described with reference to FIGS. 21A and 21B. The semiconductor layer according to this embodiment is preferably a silicon layer. The semiconductor layer may be formed of another group IV semiconductor such as SiGe, Ge, or C. Alternatively, the semiconductor layer may be formed of a III-IV compound semiconductor.

The semiconductor device includes a planar semiconductor layer 103 formed on a substrate 101; a pillar-shaped semiconductor layer 114 formed on the planar semiconductor layer 103; a gate insulating film 113 surrounding the pillar-shaped semiconductor layer 114; a first metal 104 surrounding the gate insulating film 113, the first metal 104 being in contact with an upper portion of the planar semiconductor layer 103; a gate 107 formed above the first metal 104 so as to surround the gate insulating film 113, the gate 107 being electrically insulated from the first metal 104; and a second metal 109 formed above the gate 107 so as to surround the gate insulating film 113, the second metal 109 being electrically insulated from the gate 107, the second metal 109 having an upper portion electrically connected to an upper portion of the pillar-shaped semiconductor layer 114. In this configuration, the upper portion of the second metal 109 connects to the upper portion of the pillar-shaped semiconductor layer 114 with a metal 117 therebetween. A diffusion layer may be formed in the upper portion of the planar semiconductor layer. A diffusion layer may be formed in the upper portion of the pillar-shaped semiconductor layer.

The gate insulating film 113 is preferably any one of an oxide film, a nitride film, an oxynitride film, and a high-dielectric-constant film, or preferably includes at least one of an oxide film, a nitride film, an oxynitride film, and a high-dielectric-constant film. The gate 107 is preferably formed of metal. The metal of the gate 107 preferably has a work function that enables functioning as a transistor.

The first metal 104 preferably has a first work function, and the first metal 104 and the lower portion of the pillar-shaped semiconductor layer 114 preferably have a first work function difference therebetween.

The second metal 109 preferably has a first work function, and the second metal 109 and the upper portion of the pillar-shaped semiconductor layer 114 preferably have a first work function difference therebetween.

The first work function is preferably from 4.0 eV to 4.2 eV. In this case, when the semiconductor is, for example, silicon, since the first work function is close to the work function (4.05 eV) of n-type silicon, the region surrounded by the first metal 104 and the second metal 109 functions as n-type silicon. Preferred examples of the metals include a tantalum-titanium compound (TaTi) and tantalum nitride (TaN).

The first work function is preferably from 5.0 eV to 5.2 eV. In this case, when the semiconductor is, for example, silicon, since the first work function is close to the work function (5.15 eV) of p-type silicon, the region surrounded by the first metal 104 and the second metal 109 functions as p-type silicon. Preferred examples of the metals include ruthenium (Ru) and titanium nitride (TiN).

A portion of the upper surface of the planar semiconductor layer 103, the portion being in contact with the first metal 104, serves as a region functioning as an n-type semiconductor layer or a region functioning as a p-type semiconductor layer due to the work function difference between the metal of the first metal layer 104 and the semiconductor, so that the first metal 104 can be electrically connected to the lower portion of the pillar-shaped semiconductor layer 114. In addition, the first metal 104 and the lower portion of the pillar-shaped semiconductor layer 114 are separated from each other only with the gate insulating film 113 therebetween, to thereby achieve a decrease in the resistance between the first metal 104 and the lower portion of the pillar-shaped semiconductor layer 114. Thus, a decrease in the parasitic resistance can be achieved.

The semiconductor device further includes an element isolation insulating film 102 surrounding the planar semiconductor layer 103, and the first metal 104 extends over the element isolation insulating film 102. Since the first metal 104 is formed of metal, a decrease in the resistance can be achieved between the lower portion of the pillar-shaped semiconductor layer 114 and the contact connected to the first metal 104. The first metal 104 itself can also be used as a lower wiring.

Hereinafter, a method for producing a semiconductor device according to an embodiment of the present invention will be described with reference to FIG. 1A to FIG. 21B.

Figure 1B:
FIG. 1B is a sectional view taken along plane X-X' in FIG. 1A.
Figure 1B:
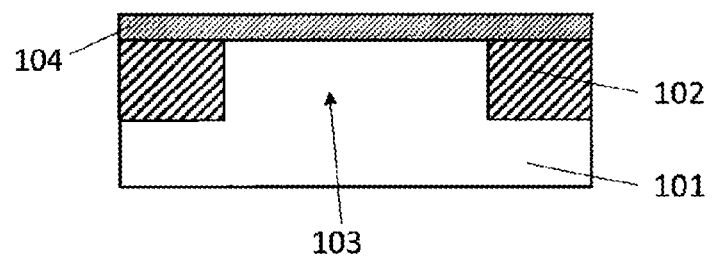

As illustrated in FIGS. 1A and 1B, a first metal 104 is deposited on a planar semiconductor layer 103, which is formed on a substrate 101. Around the planar semiconductor layer 103, an element isolation insulating film 102 is formed. A diffusion layer may be formed in the upper portion of the planar semiconductor layer.

Figure 2A:
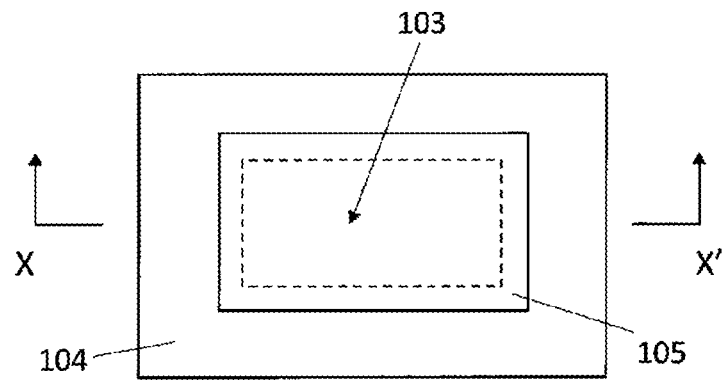
FIG. 2A is a plan view relating to a method for producing a semiconductor device according to an embodiment of the present invention.
Figure 2B:
FIG. 2B is a sectional view taken along plane X-X' in FIG. 2A.
Figure 2B:
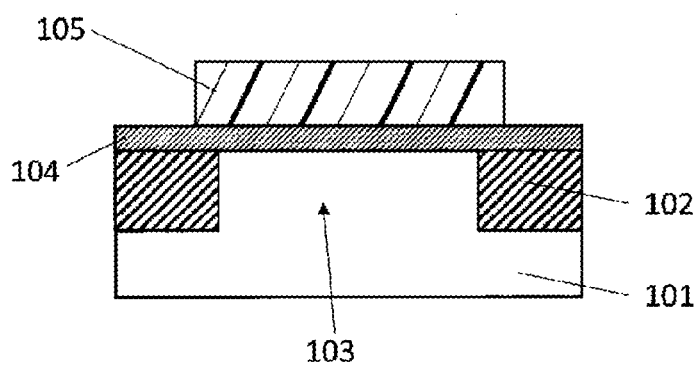

As illustrated in FIGS. 2A and 2B, on the first metal 104, a resist 105 is formed.

Figure 3A:
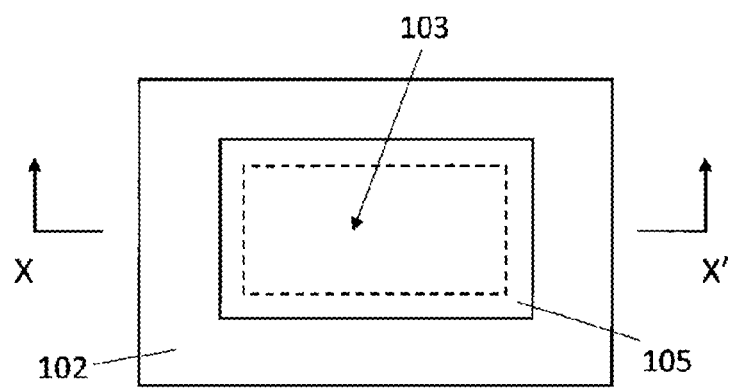
FIG. 3A is a plan view relating to a method for producing a semiconductor device according to an embodiment of the present invention.
Figure 3B:
FIG. 3B is a sectional view taken along plane X-X' in FIG. 3A.
Figure 3B:
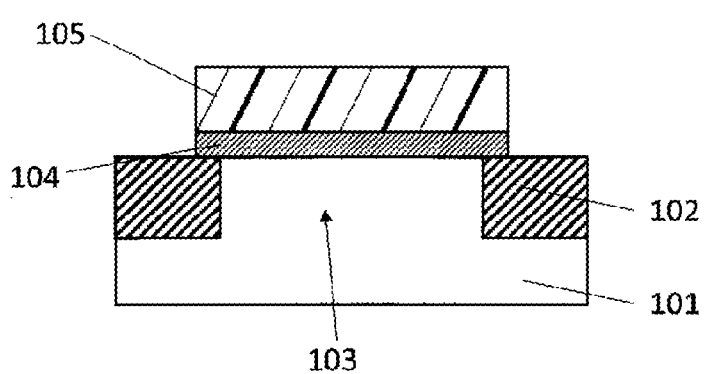

As illustrated in FIGS. 3A and 3B, the first metal 104 is etched.

Figure 4A:
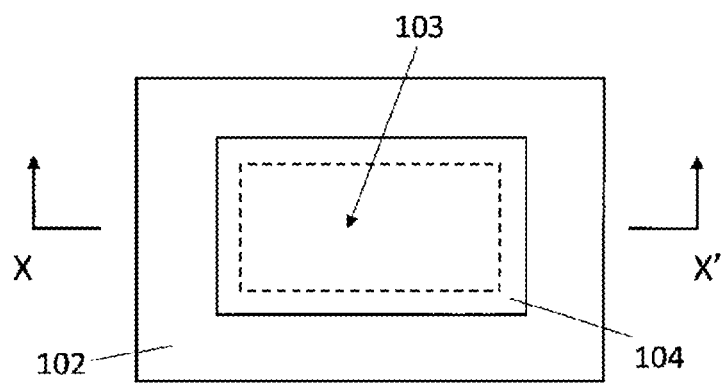
FIG. 4A is a plan view relating to a method for producing a semiconductor device according to an embodiment of the present invention.
Figure 4B:
FIG. 4B is a sectional view taken along plane X-X' in FIG. 4A.
Figure 4B:
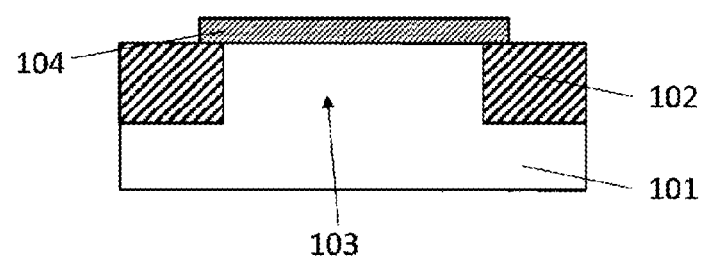

As illustrated in FIGS. 4A and 4B, the resist 105 is removed.

Figure 5A:
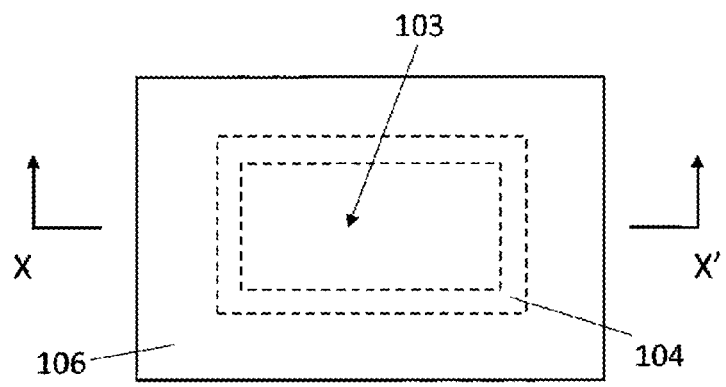
FIG. 5A is a plan view relating to a method for producing a semiconductor device according to an embodiment of the present invention.
Figure 5B:
FIG. 5B is a sectional view taken along plane X-X' in FIG. 5A.
Figure 5B:
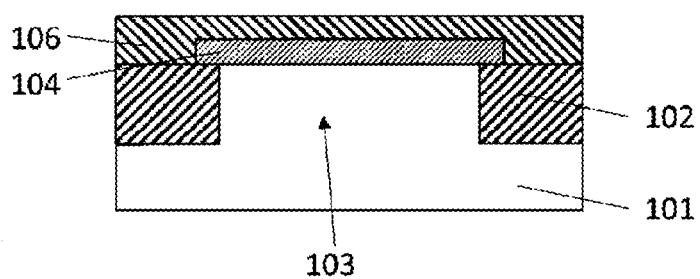

As illustrated in FIGS. 5A and 5B, on the first metal 104, a first insulating film 106 is formed.

Figure 6A:
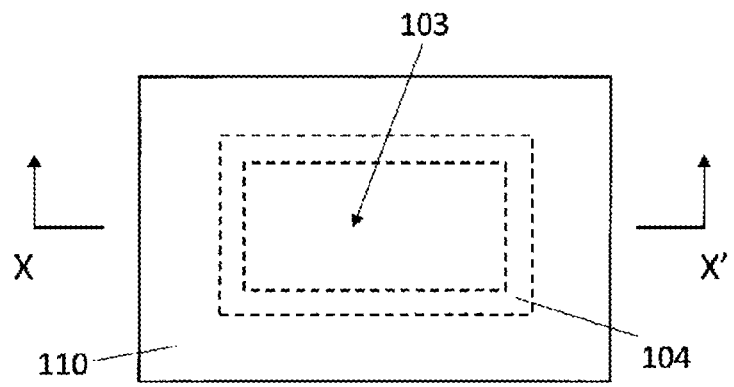
FIG. 6A is a plan view relating to a method for producing a semiconductor device according to an embodiment of the present invention.
Figure 6B:
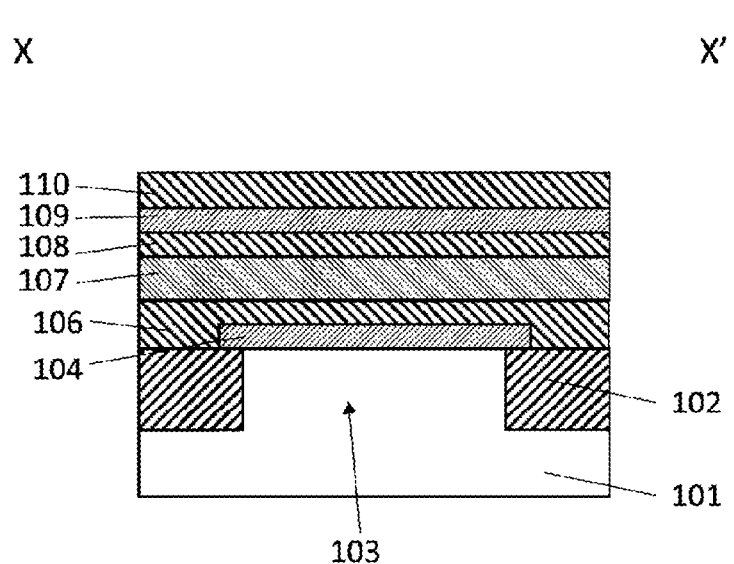
FIG. 6B is a sectional view taken along plane X-X' in FIG. 6A.

As illustrated in FIGS. 6A and 6B, on the first insulating film 106, a gate material 107 is formed with metal; on the gate material 107, a second insulating film 108 is formed; on the second insulating film 108, a second metal 109 is formed; and, on the second metal 109, a third insulating film 110 is formed.

Figure 7A:
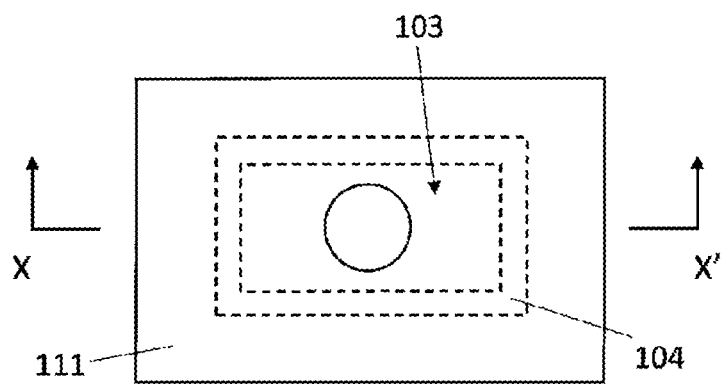
FIG. 7A is a plan view relating to a method for producing a semiconductor device according to an embodiment of the present invention.
Figure 7B:
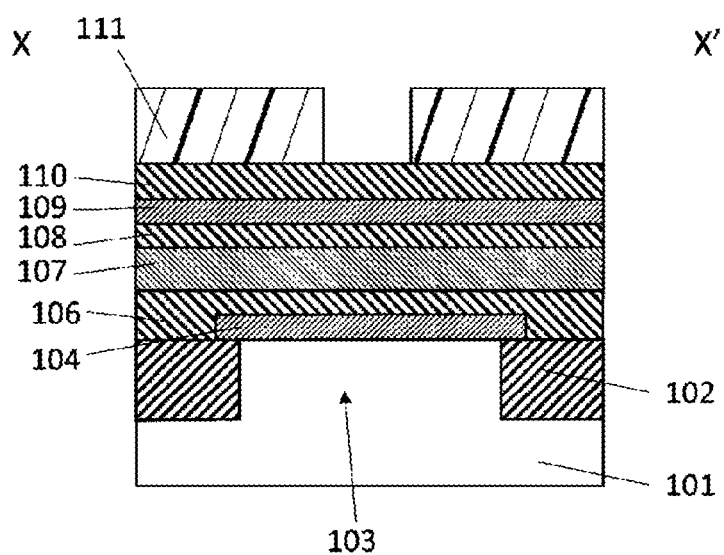
FIG. 7B is a sectional view taken along plane X-X' in FIG. 7A.

As illustrated in FIGS. 7A and 7B, a resist 111 for forming a first hole is formed.

Figure 8A:
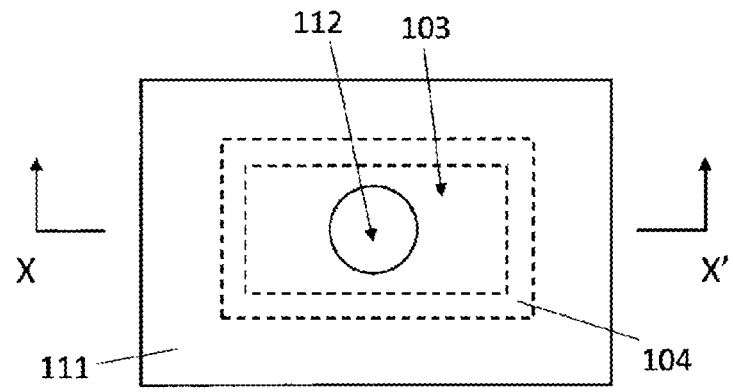
FIG. 8A is a plan view relating to a method for producing a semiconductor device according to an embodiment of the present invention.
Figure 8B:
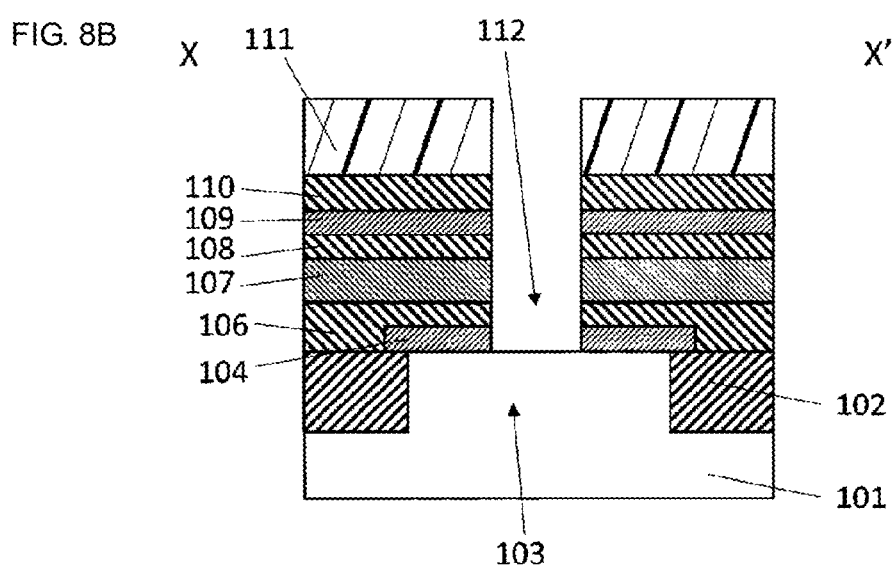
FIG. 8B is a sectional view taken along plane X-X' in FIG. 8A.

As illustrated in FIGS. 8A and 8B, a first hole 112 for forming a pillar-shaped semiconductor layer is formed in the third insulating film 110, the second metal 109, the second insulating film 108, the gate material 107 formed of metal, the first insulating film 106, and the first metal 104.

Figure 9A:
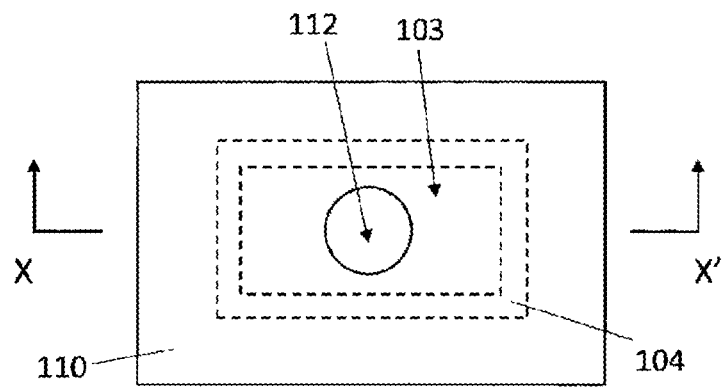
FIG. 9A is a plan view relating to a method for producing a semiconductor device according to an embodiment of the present invention.
Figure 9B:
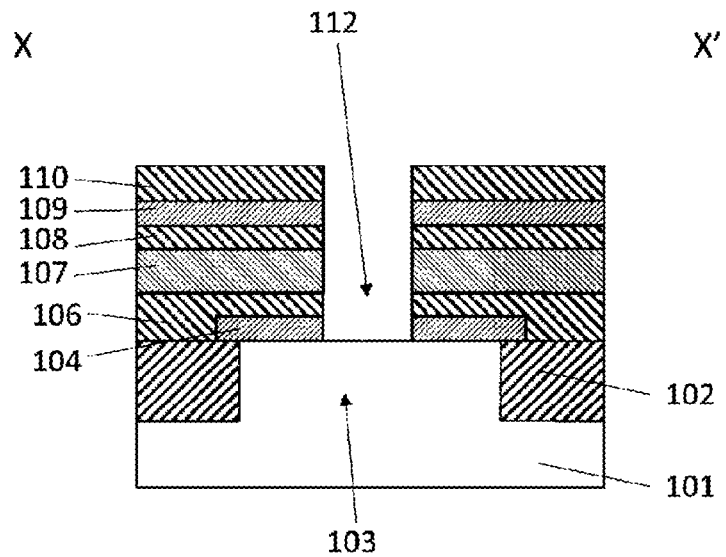
FIG. 9B is a sectional view taken along plane X-X' in FIG. 9A.

As illustrated in FIGS. 9A and 9B, the resist 111 is removed.

Figure 10A:
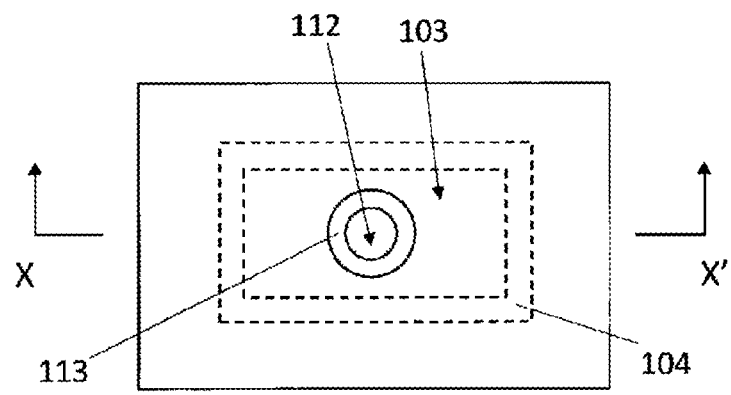
FIG. 10A is a plan view relating to a method for producing a semiconductor device according to an embodiment of the present invention.
Figure 10B:
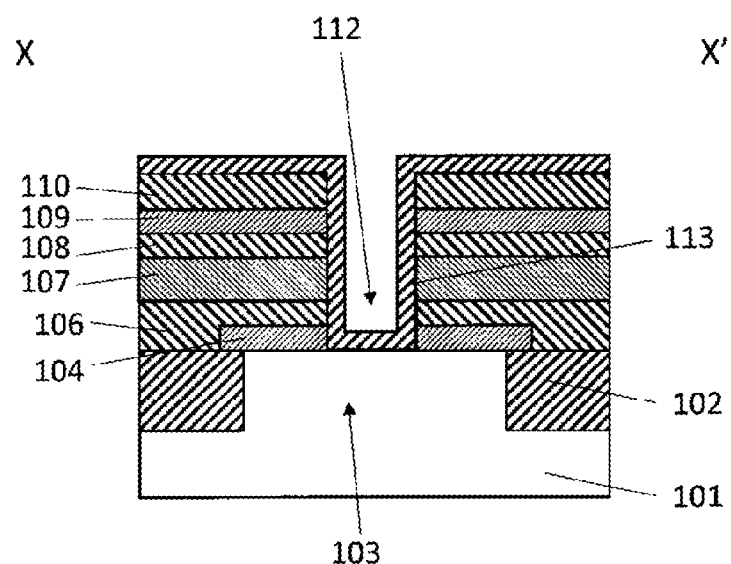
FIG. 10B is a sectional view taken along plane X-X' in FIG. 10A.

As illustrated in FIGS. 10A and 10B, a gate insulating film 113 is deposited.

Figure 11A:
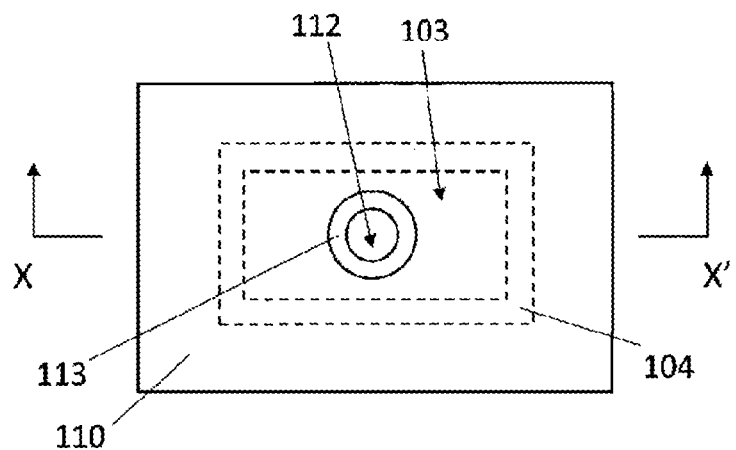
FIG. 11A is a plan view relating to a method for producing a semiconductor device according to an embodiment of the present invention.
Figure 11B:
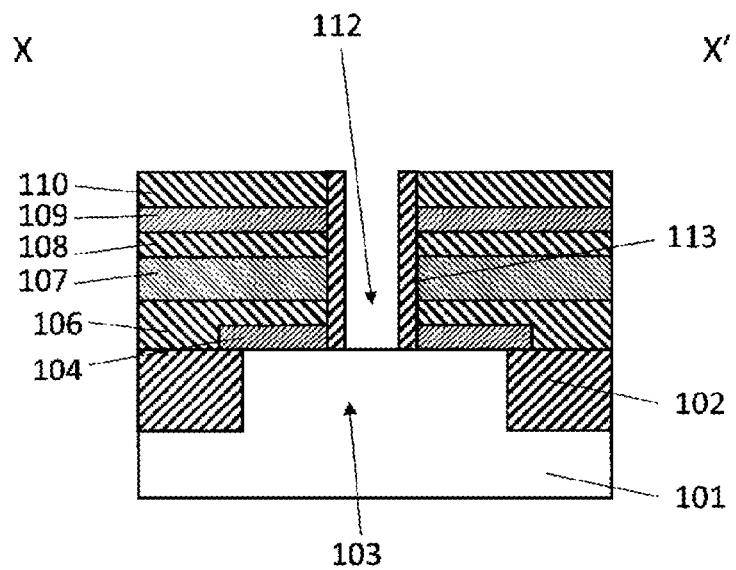
FIG. 11B is a sectional view taken along plane X-X' in FIG. 11A.

As illustrated in FIGS. 11A and 11B, the gate insulating film 113 is etched to form the gate insulating film 113 on the side surface of the first hole 112. Before epitaxial growth of the pillar-shaped semiconductor layer, the first metal 104, the gate material 107 formed of metal, and the second metal 109 are covered by the planar semiconductor layer 103, the first insulating film 106, the second insulating film 108, the third insulating film 110, and the gate insulating film 113. As a result, metal contamination in the pillar-shaped semiconductor layer can be suppressed.

Figure 12A:
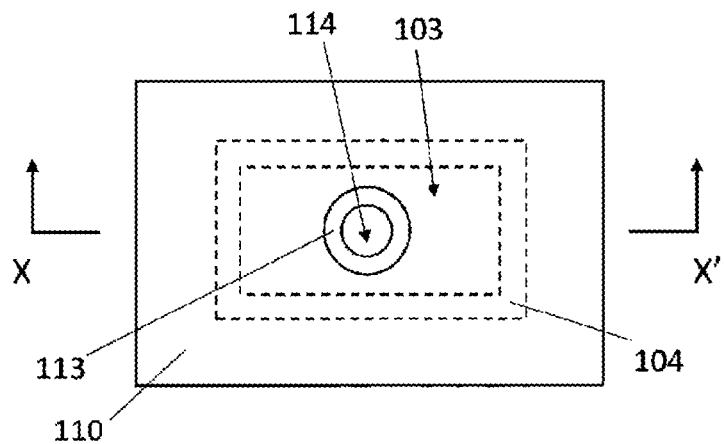
FIG. 12A is a plan view relating to a method for producing a semiconductor device according to an embodiment of the present invention.
Figure 12B:
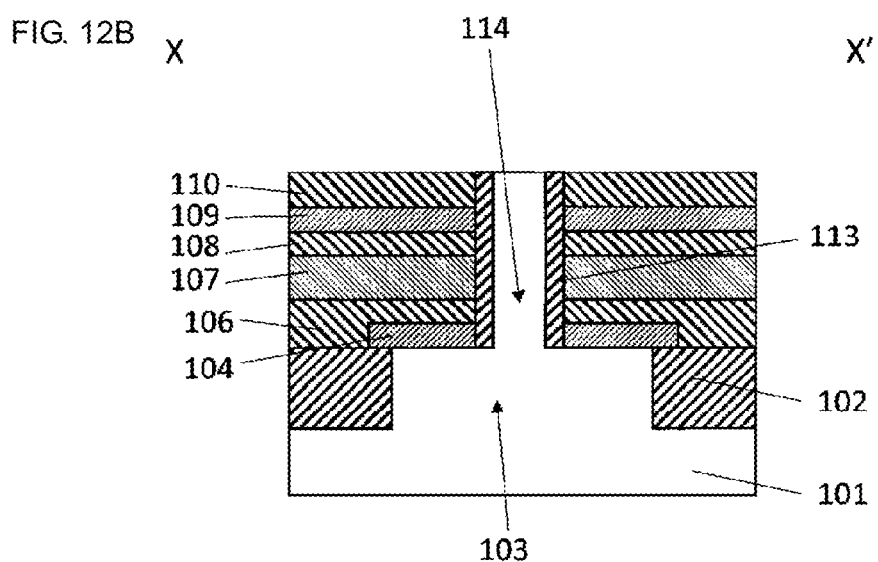
FIG. 12B is a sectional view taken along plane X-X' in FIG. 12A.

As illustrated in FIGS. 12A and 12B, a semiconductor layer is epitaxially grown, within the first hole 112, on the planar semiconductor layer 103, to thereby form a pillar-shaped semiconductor layer 114. In this way, after the gate is formed, the pillar-shaped semiconductor layer can be formed. Subsequently, in the upper portion of the pillar-shaped semiconductor layer, a diffusion layer may be formed.

Figure 13A:
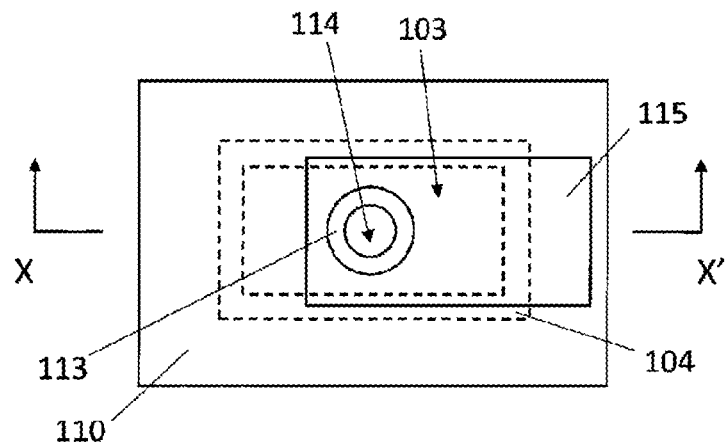
FIG. 13A is a plan view relating to a method for producing a semiconductor device according to an embodiment of the present invention.
Figure 13B:
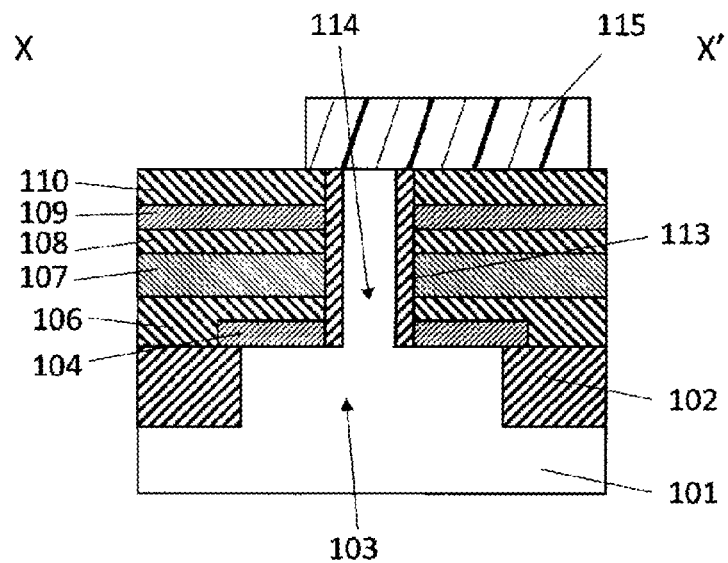
FIG. 13B is a sectional view taken along plane X-X' in FIG. 13A.

As illustrated in FIGS. 13A and 13B, a resist 115 for forming a gate wiring is formed.

Figure 14A:
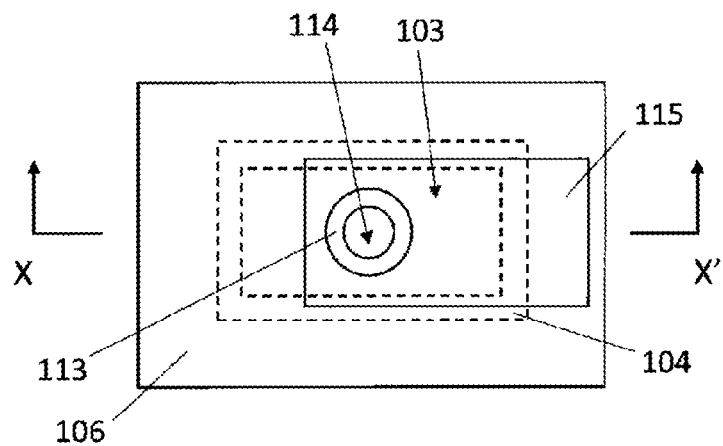
FIG. 14A is a plan view relating to a method for producing a semiconductor device according to an embodiment of the present invention.
Figure 14B:
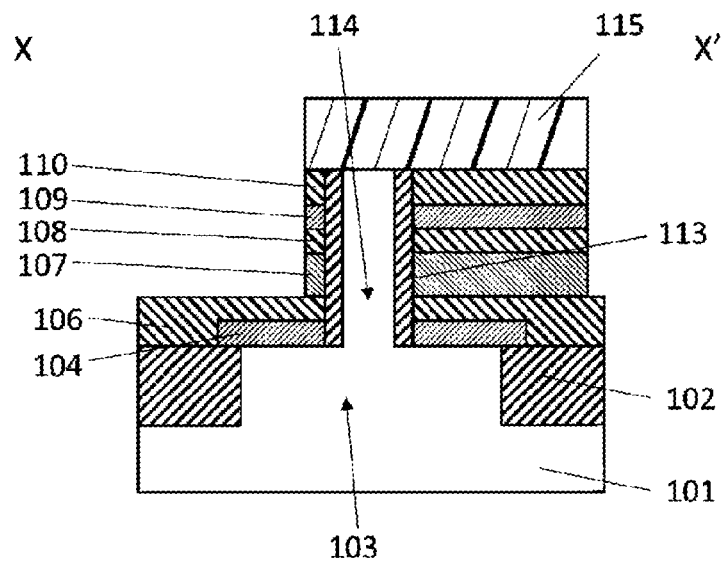
FIG. 14B is a sectional view taken along plane X-X' in FIG. 14A.

As illustrated in FIGS. 14A and 14B, the third insulating film 110, the second metal 109, the second insulating film 108, and the gate material 107 are etched to form a gate 107. The gate 107 is constituted by a gate electrode near the pillar-shaped semiconductor layer 114 and a gate wiring connected to the gate electrode.

Figure 15A:
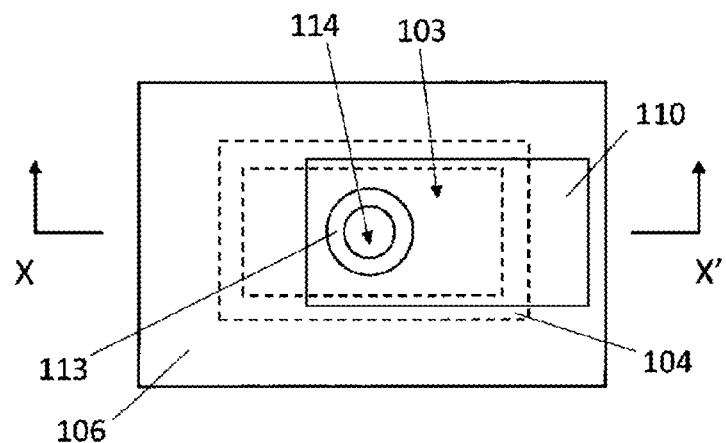
FIG. 15A is a plan view relating to a method for producing a semiconductor device according to an embodiment of the present invention.
Figure 15B:
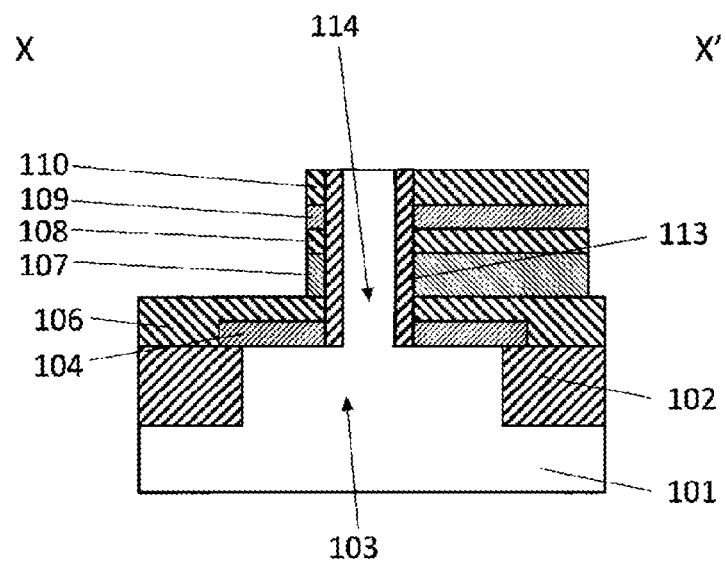
FIG. 15B is a sectional view taken along plane X-X' in FIG. 15A.

As illustrated in FIGS. 15A and 15B, the resist 115 is removed.

Figure 16A:
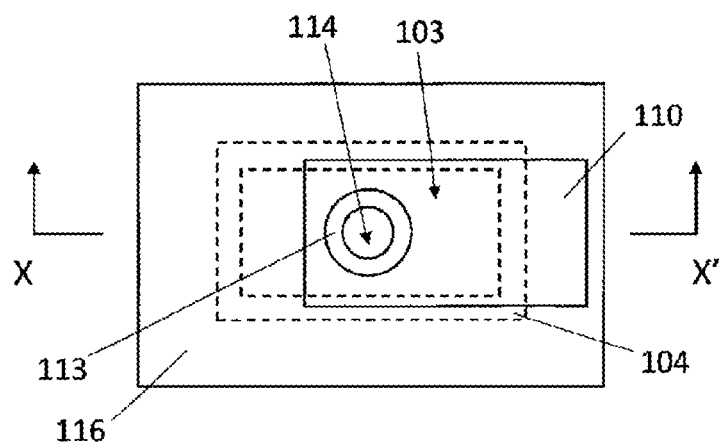
FIG. 16A is a plan view relating to a method for producing a semiconductor device according to an embodiment of the present invention.
Figure 16B:
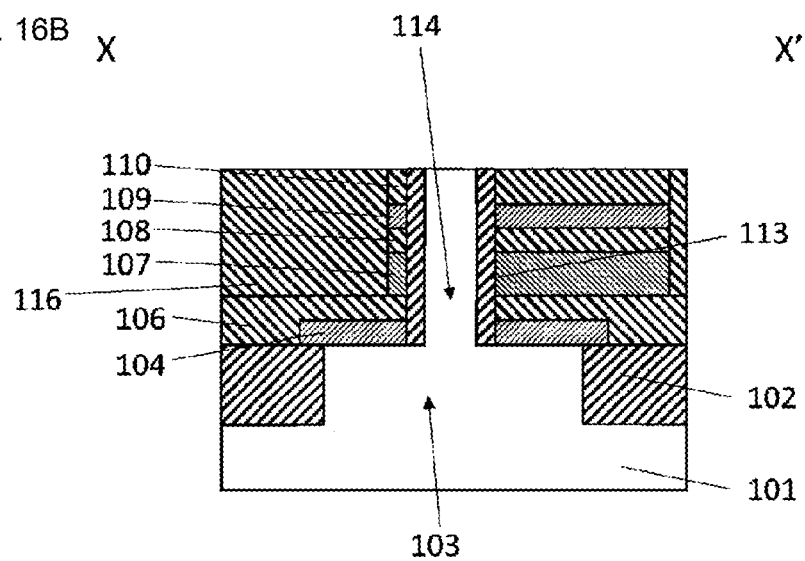
FIG. 16B is a sectional view taken along plane X-X' in FIG. 16A.

As illustrated in FIGS. 16A and 16B, an interlayer insulating film 116 is formed.

Figure 17A:
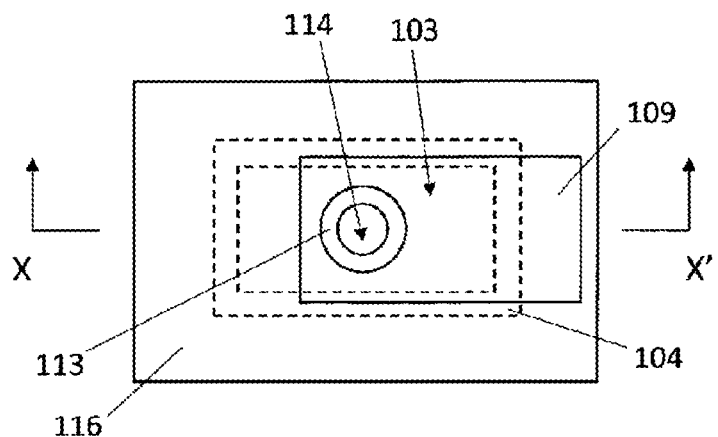
FIG. 17A is a plan view relating to a method for producing a semiconductor device according to an embodiment of the present invention.
Figure 17B:
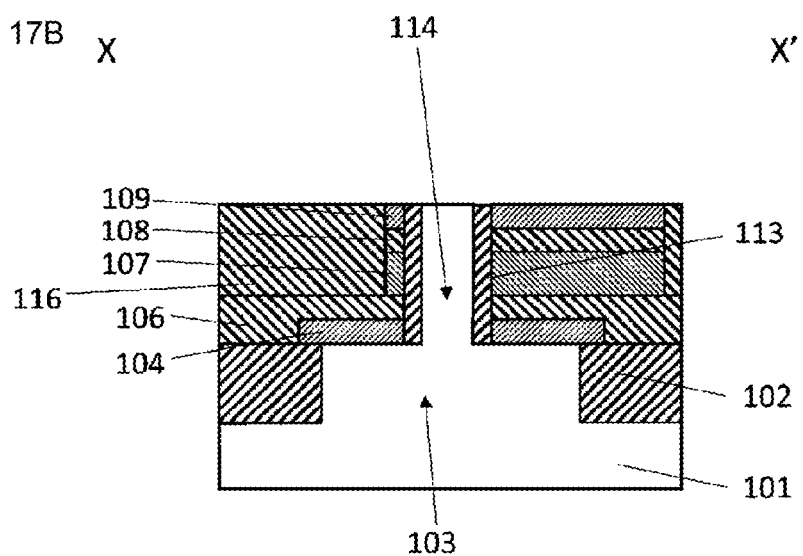
FIG. 17B is a sectional view taken along plane X-X' in FIG. 17A.

As illustrated in FIGS. 17A and 17B, the upper portion of the pillar-shaped semiconductor layer 114, the third insulating film 110, the upper portion of the interlayer insulating film 116, and the upper portion of the gate insulating film 113 are removed.

Figure 18A:
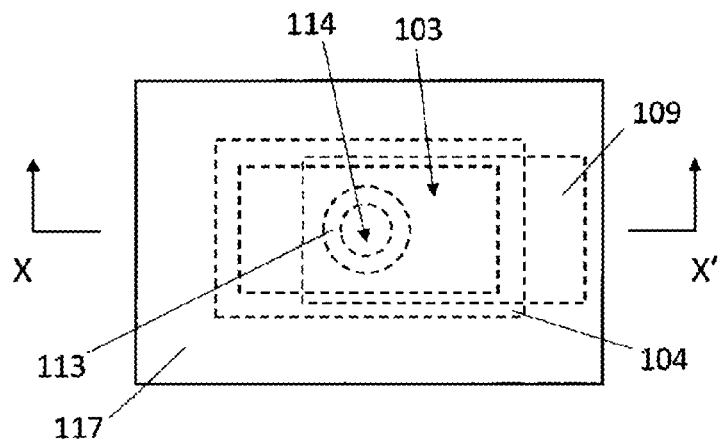
FIG. 18A is a plan view relating to a method for producing a semiconductor device according to an embodiment of the present invention.
Figure 18B:
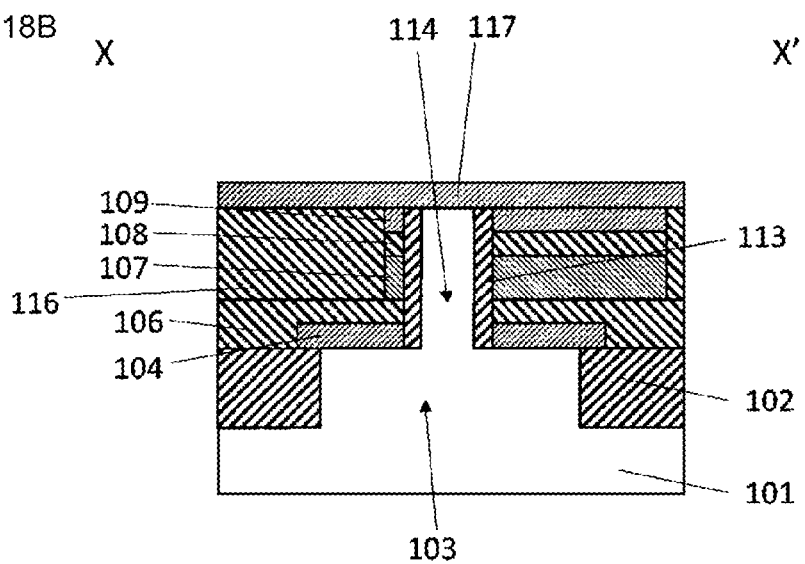
FIG. 18B is a sectional view taken along plane X-X' in FIG. 18A.

As illustrated in FIGS. 18A and 18B, a metal 117 is formed.

Figure 19A:
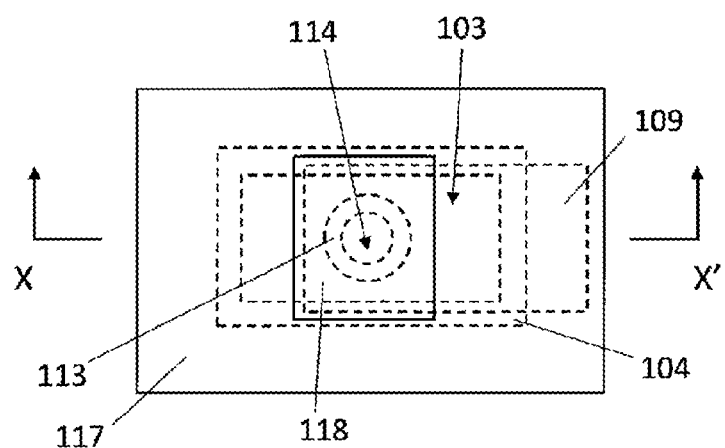
FIG. 19A is a plan view relating to a method for producing a semiconductor device according to an embodiment of the present invention.
Figure 19B:
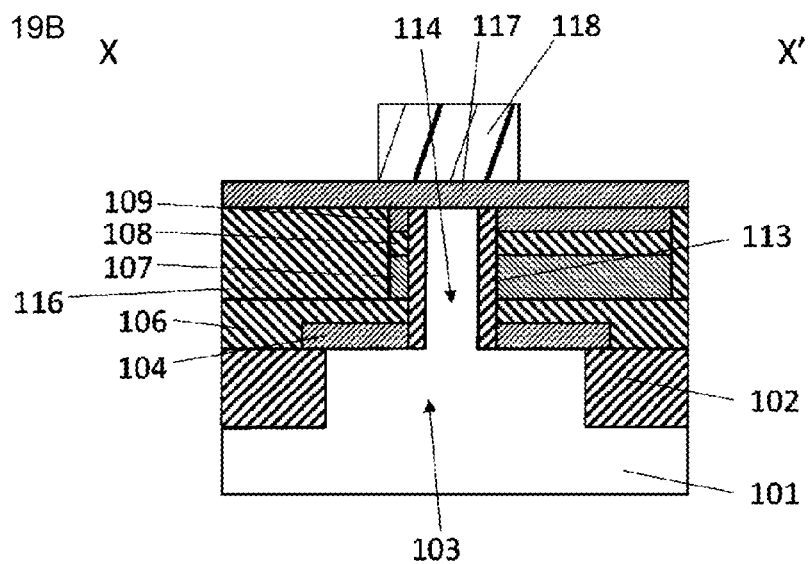
FIG. 19B is a sectional view taken along plane X-X' in FIG. 19A.

As illustrated in FIGS. 19A and 19B, a resist 118 for processing the metal 117 is formed.

Figure 20A:
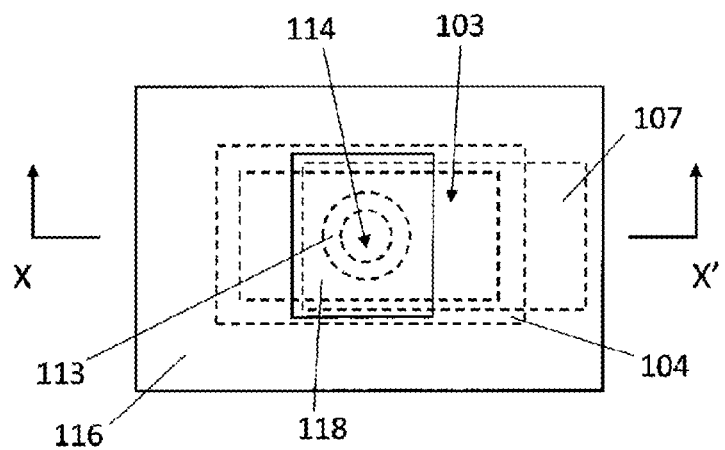
FIG. 20A is a plan view relating to a method for producing a semiconductor device according to an embodiment of the present invention.
Figure 20B:
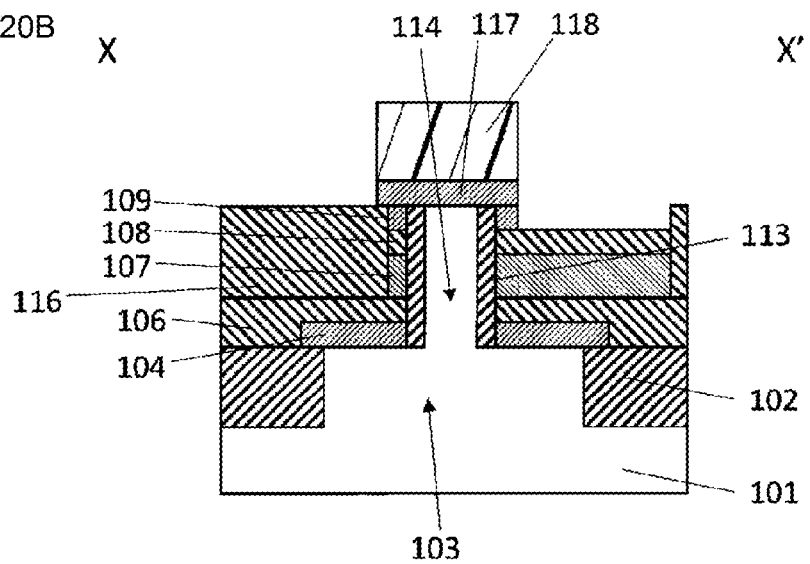
FIG. 20B is a sectional view taken along plane X-X' in FIG. 20A.

As illustrated in FIGS. 20A and 20B, the metal 117 and the second metal 109 are etched.

Figure 21A:
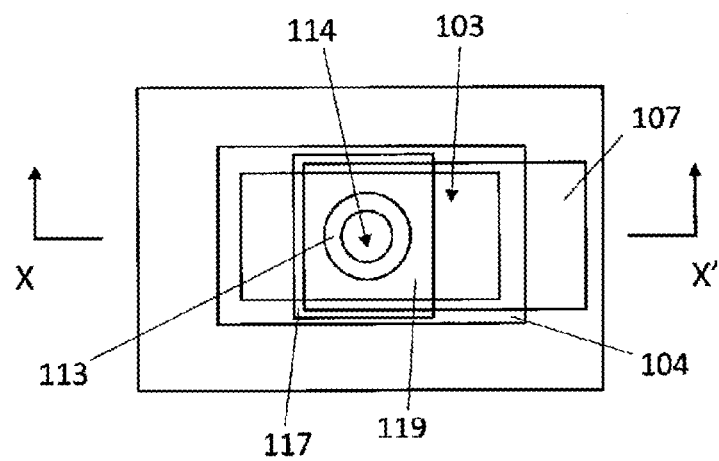
FIG. 21A is a plan view of a semiconductor device according to an embodiment of the present invention.
Figure 21B:
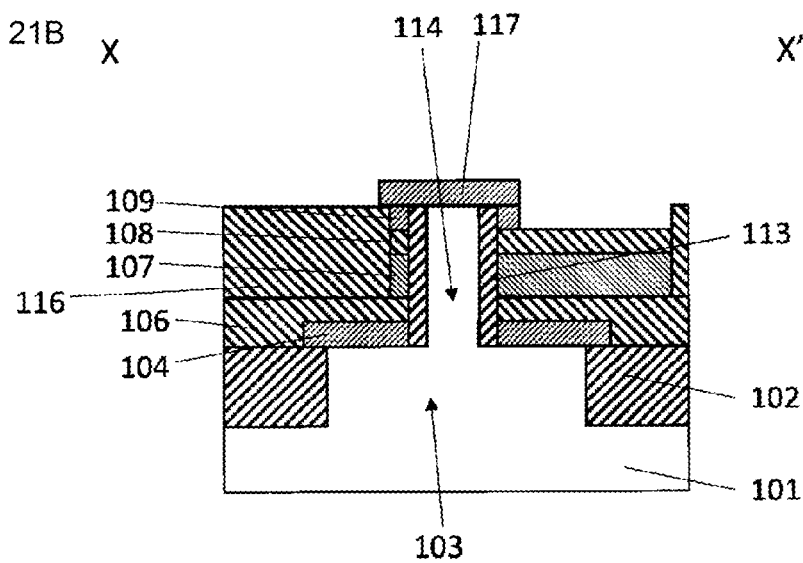
FIG. 21B is a sectional view taken along plane X-X' in FIG. 21A.

As illustrated in FIGS. 21A and 21B, the resist 118 is removed. Subsequently, a contact step may be performed, and a metal wiring step may be performed. Thus, a method for producing a semiconductor device according to an embodiment of the present invention has been described.

Incidentally, the present invention encompasses various embodiments and modifications without departing from the broad spirit and scope of the present invention. The embodiments provided above are described for illustration of examples of the present invention, and do not limit the scope of the present invention.

For example, in the above-described example, the p-type (including a $p^+$-type) and the n-type (including an $n^+$-type) in the semiconductor device may be changed to the opposite conductivity types, and the resultant semiconductor device obviously falls within the technical scope of the present invention.

What is claimed is:

1. A semiconductor device comprising:
   a planar semiconductor layer on a substrate;
   a pillar-shaped semiconductor layer on the planar semiconductor layer;
   a gate insulating film surrounding the pillar-shaped semiconductor layer;
   a first metal surrounding the gate insulating film,
   the first metal in contact with an upper portion of the planar semiconductor layer;
   an element isolation insulating film surrounding the planar semiconductor layer,
   wherein the first metal extends over the element isolation insulating film;
   a gate above the first metal and surrounding the gate insulating film, where the gate is electrically insulated from the first metal; and
   a second metal above the gate so as to surround the gate insulating film, where the second metal is electrically insulated from the gate, and has an upper portion electrically connected to an upper portion of the pillar-shaped semiconductor layer.

2. A method for producing a semiconductor device, the method comprising:
   forming a first metal on a planar semiconductor layer on a substrate;
   forming a first insulating film on the first metal;
   forming, on the first insulating film, a metal gate material;
   forming a second insulating film on the gate material;
   forming a second metal on the second insulating film;
   forming a third insulating film on the second metal;
   forming a first hole for a pillar-shaped semiconductor layer, in the third insulating film, the second metal, the second insulating film, the metal gate, the first insulating film, and the first metal;
   forming a gate insulating film on a side surface of the first hole;
   epitaxially growing a semiconductor layer, within the first hole, on the planar semiconductor layer to form the pillar-shaped semiconductor layer; and
   forming a third metal connecting the second metal and the pillar-shaped semiconductor layer.

* * * * *